(12) United States Patent
Matsui

(10) Patent No.: US 12,707,908 B2
(45) Date of Patent: Aug. 11, 2026

(54) ETCHING METHOD AND SEMICONDUCTOR ELEMENT MANUFACTURING METHOD

(71) Applicant: SHOWA DENKO K.K., Tokyo (JP)

(72) Inventor: Kazuma Matsui, Tokyo (JP)

(73) Assignee: Resonac Corporation, Tokyo (JP)

( * ) Notice: Subject to any disclaimer, the term of this patent is extended or adjusted under 35 U.S.C. 154(b) by 289 days.

(21) Appl. No.: 18/009,300

(22) PCT Filed: May 27, 2021

(86) PCT No.: PCT/JP2021/020221
§ 371 (c)(1),
(2) Date: Dec. 8, 2022

(87) PCT Pub. No.: WO2022/009553
PCT Pub. Date: Jan. 13, 2022

(65) Prior Publication Data
US 2023/0290643 A1 Sep. 14, 2023

(30) Foreign Application Priority Data
Jul. 9, 2020 (JP) ................................ 2020-118784

(51) Int. Cl.
*H10P 50/28* (2026.01)
*H10P 50/00* (2026.01)
(Continued)

(52) U.S. Cl.
CPC ............ *H10P 50/283* (2026.01); *H10P 50/73* (2026.01); *C09K 13/00* (2013.01); *H10P 50/242* (2026.01)

(58) Field of Classification Search
CPC ......... C01K 13/00–12; H01L 21/00–86; H01J 37/00–36; H01J 2237/00–339
See application file for complete search history.

(56) References Cited

U.S. PATENT DOCUMENTS 5,376,234 A 12/1994 Yanagida
2005/0014383 A1 1/2005 Ji et al.
(Continued)

FOREIGN PATENT DOCUMENTS

JP 6-13351 A 1/1994
JP 10-223614 A 8/1998
(Continued)

OTHER PUBLICATIONS

International Search Report for PCT/JP2021/020221 dated Aug. 10, 2021.

*Primary Examiner* — Duy Vu N Deo
*Assistant Examiner* — Andrew Keelan Laobak
(74) *Attorney, Agent, or Firm* — Sughrue Mion, PLLC

(57) ABSTRACT

An etching method including an etching step of bringing, in the presence of plasma, an etching gas containing a fluorine compound with three or fewer carbon atoms having at least one bond of a carbon-oxygen double bond and an ether bond in a molecule into contact with a target etching member having an etching target and a non-etching target, and selectively etching the etching target in comparison with the non-etching target. A concentration of the fluorine compound in the etching gas is 0.5 vol % or more to 40 vol % or less, and the etching target has silicon nitride.

14 Claims, 2 Drawing Sheets

(51) Int. Cl.

*H10P 50/24* (2026.01)
*C09K 13/00* (2006.01)

(56) References Cited

U.S. PATENT DOCUMENTS

| | | | | |
|---|---|---|---|---|
| 2010/0075491 | A1 | 3/2010 | Tosaka | |
| 2013/0323932 | A1 | 12/2013 | Guha | |
| 2019/0345385 | A1 * | 11/2019 | Oomori | H01L 21/31144 |

FOREIGN PATENT DOCUMENTS

| | | | | |
|---|---|---|---|---|
| JP | 2005-51236 | A | 2/2005 | |
| JP | 2012-79828 | A | 4/2012 | |
| JP | 2013-508990 | A | 3/2013 | |
| JP | 6079649 | B2 | 2/2017 | |
| KR | 10-2011-0025607 | A | 3/2011 | |
| TW | 201342466 | A * | 10/2013 | H01L 21/31116 |
| WO | WO-2011051251 | A1 * | 5/2011 | H01L 21/31116 |

* cited by examiner

ETCHING METHOD AND SEMICONDUCTOR ELEMENT MANUFACTURING METHOD

CROSS REFERENCE TO RELATED APPLICATIONS

This application is a National Stage of International Application No. PCT/JP2021/020221 filed May 27, 2021, claiming priority based on Japanese Patent Application No. 2020-118784 filed Jul. 9, 2020.

TECHNICAL FIELD

The present invention relates to an etching method and a semiconductor element manufacturing method.

BACKGROUND ART

In semiconductor manufacturing steps, as etching gases in dry etching apparatuses, chamber cleaning gases in chemical vapor deposition apparatuses (CVD apparatuses), and the like, perfluorinated compound gases such as carbon tetrafluoride ($CF_4$) and sulfur hexafluoride ($SF_6$) are used. Since these perfluorinated compounds are stable compounds and have a large influence on global warming (due to a high global warming potential), there is a concern about the negative influence on the environment in a case of being released into the atmosphere. Therefore, the development of alternative gases with a low global warming potential is desired. For example, PTL 1 and PTL 2 propose fluorocarbon gases having at least one unsaturated bond as gases with a comparatively low global warming potential.

CITATION LIST

Patent Literature

PTL 1: JP H10-223614 A
PTL 2: JP 6079649 A

SUMMARY OF INVENTION

Technical Problem

When using the fluorocarbon gases disclosed in PTL 1 and PTL 2, it is possible to etch silicon-containing films such as silicon films, silicon dioxide films, silicon nitride films, and metal silicide; however, there is no mention in PTL 1 and PTL 2 as to whether it is possible to selectively etch a silicon nitride film.

The present invention has an object of providing an etching method capable of selectively etching an etching target having silicon nitride in comparison with a non-etching target, and a semiconductor element manufacturing method.

Solution to Problem

In order to solve the problems described above, an aspect of the present invention is as follows in [1] to [11].

[1] An etching method including bringing, in the presence of plasma, an etching gas containing a fluorine compound with 3 or fewer carbon atoms having at least one bond of a carbon-oxygen double bond and an ether bond in a molecule into contact with a target etching member having an etching target which is an object to be etched by the etching gas and a non-etching target which is not an object to be etched by the etching gas, and selectively etching the etching target in comparison with the non-etching target, in which a concentration of the fluorine compound in the etching gas is 0.5 vol % or more to 40 vol % or less, and the etching target has silicon nitride.

[2] The etching method according to [1], in which the non-etching target has at least one selected from silicon oxide, a photoresist, and amorphous carbon.

[3] The etching method according to [1] or [2], in which the etching is performed under a pressure condition of 1 Pa or more to 3 kPa or less.

[4] The etching method according to any one of [1] to [3], in which the etching is performed under a temperature condition of 0° C. or higher to 200° C. or lower.

[5] The etching method according to any one of [1] to [4], in which the concentration of the fluorine compound in the etching gas is 1 vol % or more to 30 vol % or less.

[6] The etching method according to any one of [1] to [5], in which the etching gas is a mixed gas containing the fluorine compound and a dilution gas.

[7] The etching method according to [6], in which the dilution gas is at least one selected from nitrogen gas, helium, argon, neon, krypton, and xenon.

[8] The etching method according to any one of [1] to [5], in which the etching gas is a mixed gas containing the fluorine compound, a noble gas, and nitrogen gas, and a concentration of the nitrogen gas in the etching gas is 10 vol % or less.

[9] The etching method according to [8], in which the etching gas is a mixed gas containing, in addition to the fluorine compound, a noble gas, and nitrogen gas, an oxygen-containing gas other than the fluorine compound.

[10] The etching method according to any one of [1] to [9], in which the fluorine compound is at least one selected from carbonyl fluoride, oxalyl fluoride, and hexafluoropropylene oxide.

[11]A semiconductor element manufacturing method for manufacturing a semiconductor element using the etching method according to any one of [1] to [10], in which the target etching member is a semiconductor substrate having the etching target and the non-etching target, and the semiconductor element manufacturing method includes removing at least a part of the etching target from the semiconductor substrate by the etching.

Advantageous Effects of Invention

According to the present invention, it is possible to selectively etch an etching target having silicon nitride in comparison with a non-etching target.

DESCRIPTION OF EMBODIMENTS

Figure 1:
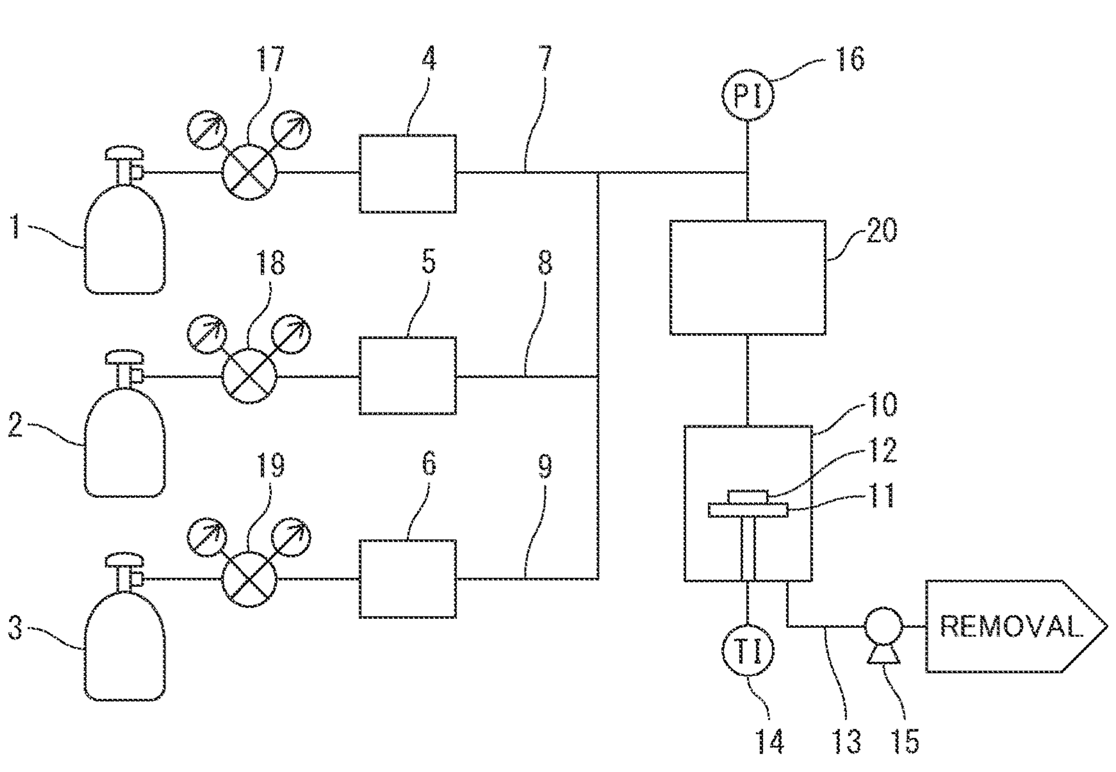
FIG. 1 is a schematic diagram of an example of an etching apparatus illustrating an embodiment of the etching method according to the present invention.

A description will be given below of one embodiment of the present invention. The present embodiment illustrates an example of the present invention and the present invention is not limited to the present embodiment. In addition, it is possible to make various modifications or improvements to the present embodiment and also to include embodiments with such modifications or improvements in the present invention.

The etching method according to the present embodiment is provided with an etching step of bringing, in the presence of plasma, an etching gas containing a fluorine compound into contact with a target etching member having an etching target which is an object to be etched by the etching gas and a non-etching target which is not an object to be etched by the etching gas, and selectively etching the etching target in comparison with the non-etching target.

The fluorine compound described above is a fluorine compound with 3 or fewer carbon atoms and having at least one bond of a carbon-oxygen double bond (carbonyl group) and an ether bond in the molecule. In addition, the concentration of the fluorine compound in the etching gas is 0.5 vol % or more to 40 vol % or less. Furthermore, the etching target has silicon nitride.

When the etching gas is brought into contact with the target etching member, the fluorine compound in the etching gas reacts with the silicon nitride in the etching target, thus, etching of the etching target proceeds. In contrast, since the non-etching target hardly reacts with the fluorine compound, etching of the non-etching target hardly proceeds. Thus, according to the etching method according to the present embodiment, it is possible to selectively etch the etching target in comparison with the non-etching target.

In addition, according to the etching method according to the present embodiment, it is possible to selectively etch an etching target having silicon nitride without using gases of perfluorinated compounds such as carbon tetrafluoride and sulfur hexafluoride, which have a high global warming potential. Thus, it is possible for the etching method according to the present embodiment to reduce the environmental burden caused by the use of etching gases and suppress the negative influence on global warming.

Etching in the present invention means processing a target etching member into a predetermined shape (for example, a three-dimensional shape) by removing part or all of an etching target of the target etching member (for example, processing a film-like etching target formed of silicon nitride of the target etching member into a predetermined film thickness) as well as meaning removing residues and deposits formed of the etching target from the target etching member for cleaning or the like.

It is possible to use the etching method according to the present embodiment for manufacturing semiconductor elements. That is, the semiconductor element manufacturing method according to the present embodiment is a semiconductor element manufacturing method which manufactures a semiconductor element using the etching method according to the present embodiment, in which the target etching member is a semiconductor substrate having an etching target and a non-etching target, and the method is provided with a processing step of removing at least a part of the etching target from the semiconductor substrate by etching.

For example, in the etching method according to the present embodiment, the etching proceeds more rapidly with silicon nitride (for example, $Si_3N_4$) than silicon oxide (for example, $SiO_2$). By using this characteristic, it is possible to use the etching method according to the present embodiment for manufacturing semiconductor elements such as 3D-NAND flash memory and logic devices.

For example, by applying the etching method according to the present embodiment to a laminate formed by alternately laminating silicon oxide films and silicon nitride films, in which a through hole extending in the laminating direction and through the laminate is formed (refer to FIG. 3), the silicon nitride films exposed at the inner surface of the through hole are selectively and isotropically etched, thus, it is possible to form a structure in which the edges of the silicon oxide films protrude into the through hole. With the process for forming a structural body having such a structure, it is possible to use the structural body as the structural body of a semiconductor element, thus, the process is used in the manufacturing of semiconductor elements such as 3D-NAND flash memory and logic devices.

In the related art, the process of forming the structure described above by etching has been performed using chemicals containing phosphoric acid or the like; however, etching using etching gas is superior to etching using chemicals in terms of microfabrication. Therefore, it is expected that the etching method according to the present embodiment will contribute to further miniaturization and higher integration for semiconductor elements.

In addition, similarly, in a case where the non-etching target itself is used as the structural body of the semiconductor element, a material that substantially does not react with fluorine compounds or a material that reacts extremely slowly with fluorine compounds is used as the non-etching target. Specifically, for example, it is possible to use at least one material selected from silicon oxide (for example, $SiO_2$), a photoresist, and amorphous carbon (C).

Furthermore, it is also possible to use the etching method according to the present embodiment for cleaning, as described above. For example, after performing a step of depositing a film formed of a material containing silicon nitride on a substrate or a step of etching a film of a material containing silicon nitride formed on a substrate in a chamber, it is possible to remove and clean the attached material containing silicon nitride attached to the inner surface of the chamber by the etching method according to the present embodiment. In such cleaning, the chamber corresponds to the target etching member, which is a constituent requirement of the present invention, and the attached material corresponds to the etching target, which is a constituent requirement of the present invention.

A more detailed description will be given of the etching method and semiconductor element manufacturing method according to the present embodiment.

It is possible to achieve the etching of the present embodiment by plasma etching. The type of plasma source in plasma etching is not particularly limited and commercially available apparatuses may be used. Examples thereof include high frequency discharge plasma such as inductively coupled plasma (ICP) and capacitively coupled plasma (CCP), or microwave discharge plasmas such as electron cyclotron resonance plasma (ECRP).

In addition, a plasma generating chamber may be separated from the chamber in which the target etching member is installed and the plasma may be generated in the plasma generating chamber (that is, remote plasma may be used). Etching using remote plasma may enable the etching of etching targets having silicon nitride with high selectivity. An etching method in which etching is performed in a chamber by a plasma of etching gas generated outside the chamber by a plasma generator may be described as "remote plasma etching."

[Etching Gas]

The etching gas is a gas containing a fluorine compound with 3 or fewer carbon atoms having at least one bond of a carbon-oxygen double bond and an ether bond in the molecule. Examples of functional groups having carbon-oxygen double bonds include carbonyl groups (—(C═O)—) and formyl groups (—(C═O)H). Ether bonds (—O—) may be cyclic ether bonds. The type of fluorine compound is not particularly limited as long as the requirements described above are satisfied and examples thereof include formyl fluoride, carbonyl fluoride, oxalyl fluoride, 2,2,2-trifluoroacetyl fluoride, 2,2-difluoroacetyl fluoride, 2-fluoroacetyl fluoride, acetyl fluoride, 2,2,3,3,3-pentafluoropropanoyl fluoride, 2,2,3,3,-tetrafluoropropanoyl fluoride, 2,3,3,3-tetrafluoropropanoyl fluoride, 3,3,3-trifluoropropanoyl fluoride, 2,3,3-trifluoropropanoyl fluoride, 2,2,3-trifluoropropanoyl fluoride, 2,2-difluoropropanoyl fluoride, 2,3-difluoropropanoyl fluoride, 3,3 difluoropropanoyl fluoride, 2-fluoropropanoyl fluoride, 3-fluoropropanoyl fluoride, propanoyl fluoride, perfluoroisopropanoyl fluoride, hexafluoroacetone, hexafluoropropylene oxide, tetrafluoroethylene oxide, trifluoromethyl ether, and the like. One of these fluorine compounds may be used alone or two or more may be used in combination. Among these fluorine compounds, from the viewpoint of ease of handling and availability, at least one selected from carbonyl fluoride ($COF_2$), oxalyl fluoride ($(COF)_2$), and hexafluoropropylene oxide ($C_3F_6O$) is more preferable. Most fluorine compounds with 4 or more carbon atoms having at least one bond of a carbon-oxygen double bond and an ether bond in the molecule are not preferable due to low volatility, which makes handling as an etching gas difficult.

The etching gas is a mixed gas containing a fluorine compound gas and another type of gas and it is necessary for the concentration of the fluorine compound in the etching gas to be 0.5 vol % or more to 40 vol % or less, preferably 1 vol % or more to 30 vol % or less, and more preferably 2 vol % or more to 30 vol % or less.

When plasma etching is performed with the concentration of the fluorine compound in the etching gas in the range described above, it is possible to selectively etch an etching target having silicon nitride in comparison with a non-etching target. For example, the etching selectivity ratio, which is the ratio of the etching rate of the etching target to the etching rate of the non-etching target, easily becomes 5 or more. An etching selectivity ratio of 5 or more is preferable, 7 or more is more preferable, and 10 or more is even more preferable.

It is possible to use an inert dilution gas as the other type of gas that forms the etching gas together with the fluorine compound gas. That is, it is possible for the etching gas to be a mixed gas containing a fluorine compound and a dilution gas.

As the dilution gas, it is possible to use at least one selected from nitrogen gas ($N_2$), helium (He), neon (Ne), argon (Ar), Krypton (Kr), and Xenon (Xe).

In particular, when the etching gas contains a small amount of nitrogen gas, that is, when the etching gas is a mixed gas containing a fluorine compound, a noble gas, and nitrogen gas, the etching rate of silicon nitride may be improved. For example, the concentration of nitrogen gas in the etching gas is preferably 10 vol % or less, more preferably 5 vol % or less, and even more preferably 3 vol % or less. The noble gas is at least one selected from helium, neon, argon, krypton, and xenon.

In addition, in a case where the etching gas contains a noble gas and a small amount of nitrogen gas, when an oxygen-containing gas is further added thereto, the etching rate of silicon nitride may be improved and the etching selectivity ratio may be improved. Here, oxygen-containing gases are compounds that are gaseous under standard conditions and that have oxygen atoms in the molecules other than the fluorine compounds described above. Examples of oxygen-containing gases include oxygen gas ($O_2$), ozone ($O_3$), nitrogen monoxide (NO), nitrogen dioxide ($NO_2$), nitrous oxide ($N_2O$), sulfur dioxide ($SO_2$), sulfur trioxide ($SO_3$), carbon monoxide (CO), carbon dioxide ($CO_2$), and the like. In particular, from the point of view of ease of handling, oxygen gas, nitrogen monoxide, nitrogen dioxide, nitrous oxide, sulfur dioxide, and carbon dioxide are preferable and oxygen, nitrogen monoxide, and nitrous oxide are more preferable.

The volume ratio of oxygen-containing gas with respect to nitrogen gas in the etching gas (oxygen-containing gas/nitrogen gas) is preferably 0.1 or more to 2 or less, more preferably 0.15 or more to 1 or less, and even more preferably 0.2 or more to 0.6 or less. When the volume ratio of nitrogen gas with respect to oxygen-containing gas is in the range described above, it is easy to obtain the effect of improving the etching rate of silicon nitride and the effect of improving the etching selectivity ratio.

[Pressure Conditions of Etching Step]

Although the pressure condition for the etching step in the etching method according to the present embodiment is not particularly limited, the pressure condition is preferably 1 Pa or more to 3 kPa or less, more preferably 3 Pa or more to 2 kPa or less, and even more preferably 10 Pa or more to 1.5 kPa or less. When the pressure condition is in the range described above, it is easier to stably generate plasma.

For example, it is possible to arrange a target etching member in a chamber and perform etching while passing etching gas through the chamber and to set the pressure in the chamber at the time of passing the etching gas to 1 Pa or more to 3 kPa or less. The flow rate of etching gas may be set appropriately such that the pressure in the chamber is maintained at a constant level, depending on the size of the chamber and the capacity of the exhaust system to depressurize the chamber.

[Temperature Condition for Etching Step]

Although the temperature condition of the etching step in the etching method according to the present embodiment is not particularly limited, the temperature condition is preferably 0° C. or higher to 200° C. or lower, more preferably 5° C. or higher to 170° C. or lower, and even more preferably 20° C. or higher to 150° C. or lower. When the temperature condition is in the range described above, it is possible for the fluorine compound to exist in a gaseous state and the etching rate of silicon nitride is easily made to be high. Here, the temperature in the temperature condition is the temperature of the target etching member, but it is also possible to use the temperature of a stage installed in the chamber of the etching apparatus which supports the target etching member.

Fluorine compounds hardly react with non-etching targets such as silicon oxide, photoresists, and amorphous carbon at a temperature of 200° C. or lower. Therefore, when the target etching member is etched with the etching method according to the present embodiment, it is possible to selectively etch the etching target having silicon nitride with almost no etching of the non-etching target. Thus, it is possible to use the etching method according to the present embodiment for a method of processing an etching target having silicon nitride into a predetermined shape by using a patterned non-etching target as a resist or mask.

Furthermore, when the temperature of the etching target and the non-etching target is 200° C. or lower, it is easy to increase the etching selectivity. For example, the etching selectivity ratio, which is the ratio of the etching rate of the etching target having silicon nitride to the etching rate of the non-etching target, easily becomes 5 or higher.

[Target Etching Member]

The target etching member to be etched by the etching method according to the present embodiment has an etching target and a non-etching target, but may be a member having a portion formed of an etching target and a portion formed of a non-etching target, or may be a member formed of a mixture of an etching target and a non-etching target. In addition, the target etching member may also have a part other than the etching target and the non-etching target.

The shape of the target etching member is not particularly limited and may be, for example, a plate shape, a foil shape, a film shape, a powder, or a lump. An example of a target etching member is the semiconductor substrate described above.

[Etching Target]

The etching target has silicon nitride, but may be formed solely of silicon nitride, may have portions formed solely of silicon nitride and portions formed of other materials, or may be formed of a mixture of silicon nitride and other materials.

Silicon nitride refers to a compound having any ratio of silicon and nitrogen, an example being $Si_3N_4$. The purity of silicon nitride is not particularly limited, but is preferably 30% by mass or more, more preferably 60% by mass or more, and even more preferably 90% by mass or more.

In addition, the shape of the etching target is not particularly limited and may be, for example, a plate shape, a foil shape, a film shape, a powder, or a lump.

[Non-Etching Target]

A non-etching target does not substantially react with fluorine compounds or reacts extremely slowly with fluorine compounds, thus, etching hardly proceeds even when etching is performed by the etching method according to the present embodiment. Non-etching targets are not particularly limited other than having the properties described above and examples thereof include silicon oxide, photoresists, amorphous carbon, metals such as titanium nitride, copper, nickel, and cobalt, as well as oxides and nitrides of these metals. Among the above, silicon oxide, photoresists, and amorphous carbon are more preferable from the viewpoint of ease of handling and availability.

Photoresists refer to photosensitive compositions for which properties such as the solubility are changed by light, electron beams, or the like. Examples thereof include photoresists for use with g-line, h-line, i-line, KrF, ArF, F2, EUV, and the like. The composition of the photoresist is not particularly limited beyond being a photoresist commonly used in semiconductor manufacturing steps and examples thereof include compositions containing polymers synthesized from at least one type of monomer selected from chain olefins, cyclic olefins, styrene, vinyl phenol, acrylic acid, methacrylate, epoxy, melamine, and glycol.

In addition, it is possible to use the non-etching target as a resist or mask to suppress etching of the etching target by the etching gas. Thus, as the etching method according to the present embodiment, it is possible to use a method such as processing an etching target into a predetermined shape by using the patterned non-etching target as a resist or mask (for example, processing a film-like etching target of the target etching member into a predetermined film thickness), thus, suitable use is possible with respect to the manufacturing of a semiconductor element. In addition, since the non-etching target is hardly etched, it is possible to suppress etching of portions of the semiconductor element that are not to be etched and to prevent the loss of characteristics of the semiconductor element due to etching.

It is possible to remove the non-etching target remaining after patterning by removal methods commonly used in a semiconductor element manufacturing step. Examples thereof include ashing with oxidizing gases such as oxygen plasma or ozone, or dissolution and removal methods using chemicals such as APM (a mixture of ammonia water and hydrogen peroxide water), SPM (a mixture of sulfuric acid and hydrogen peroxide water), or organic solvents.

Next, with reference to FIG. 1, a description will be given of an example of a configuration of an etching apparatus capable of implementing the etching method according to the present embodiment and an example of an etching method using the etching apparatus. The etching apparatus in FIG. 1 is a remote plasma etching apparatus that performs remote plasma etching. First, a description will be given of the etching apparatus in FIG. 1.

The etching apparatus in FIG. 1 is provided with a chamber 10 inside which etching is performed, a remote plasma generator 20 that is a plasma generator, a stage 11 that supports a target etching member 12 to be etched inside the chamber 10, a thermometer 14 that measures the temperature of the target etching member 12, an exhaust piping 13 for discharging the gas inside the chamber 10, a vacuum pump 15 provided in the exhaust piping 13 to reduce the pressure inside the chamber 10, and a pressure gauge 16 to measure the pressure inside the chamber 10.

In addition, the etching apparatus in FIG. 1 is provided with an etching gas supply portion that supplies etching gas to the inside of the chamber 10. This etching gas supply portion has a fluorine compound gas supply portion 1 that supplies fluorine compound gas, a noble gas supply portion 2 that supplies noble gas, a nitrogen gas supply portion 3 that supplies nitrogen gas, a fluorine compound gas supply piping 7 that connects the fluorine compound gas supply portion 1 to the chamber 10, a noble gas supply piping 8 connecting the noble gas supply portion 2 to the middle section of the fluorine compound gas supply piping 7, and a nitrogen gas supply piping 9 connecting the nitrogen gas supply portion 3 to the middle section of the noble gas supply piping 8.

The etching apparatus in FIG. 1 has the remote plasma generator 20 outside the chamber 10. In detail, the etching apparatus in FIG. 1 has the remote plasma generator 20 at a position between the connection portion of the noble gas supply piping 8 in the fluorine compound gas supply piping 7 and the chamber 10.

Furthermore, the fluorine compound gas supply piping 7 is provided with a fluorine compound gas pressure controller 17 that controls the pressure of the fluorine compound gas and a fluorine compound gas flow rate controller 4 that controls the flow rate of the fluorine compound gas. Furthermore, the noble gas supply piping 8 is provided with a noble gas pressure controller 18 that controls the pressure of the noble gas and a noble gas flow rate controller 5 that controls the flow rate of the noble gas. Furthermore, the nitrogen gas supply piping 9 is provided with a nitrogen gas pressure controller 19 that controls the pressure of the nitrogen gas and a nitrogen gas flow rate controller 6 that controls the flow rate of the nitrogen gas.

In a case where a fluorine compound gas is supplied to the chamber 10 as an etching gas, the fluorine compound gas is sent from the fluorine compound gas supply portion 1 to the fluorine compound gas supply piping 7, such that the fluorine compound gas is supplied through the fluorine compound gas supply piping 7 to the remote plasma generator 20.

In addition, in a case where a mixed gas of a fluorine compound gas, a noble gas, and nitrogen gas is supplied as the etching gas, the fluorine compound gas is sent from the fluorine compound gas supply portion 1 to the fluorine compound gas supply piping 7, and the noble gas and nitrogen gas are respectively sent through the noble gas supply piping 8 and nitrogen gas supply piping 9 from the noble gas supply portion 2 and nitrogen gas supply portion 3 to the fluorine compound gas supply piping 7, such that the mixed gas is supplied to the remote plasma generator 20 through the fluorine compound gas supply piping 7.

The fluorine compound gas or mixed gas is changed to plasma form in the remote plasma generator 20 and supplied to the inside of the chamber 10. The remote plasma generator 20 and the chamber 10 may be directly connected or may be connected by piping.

The configuration of the fluorine compound gas supply portion 1, the noble gas supply portion 2, and the nitrogen gas supply portion 3 is not particularly limited and may be a bottle, a cylinder, or the like, for example. In addition, as the fluorine compound gas flow rate controller 4, the noble gas flow rate controller 5, and the nitrogen gas flow rate controller 6, for example, it is possible to use mass flow controllers, flow meters, and the like.

When supplying etching gas to chamber 10, it is preferable to carry out the supply while maintaining the etching gas pressure (that is, the value of the fluorine compound gas pressure controller 17 in FIG. 1) at a predetermined value. That is, the supply pressure of the etching gas is preferably 1 Pa or more to 0.2 MPa or less, more preferably 10 Pa or more to 0.1 MPa or less, and even more preferably 50 Pa or more to 50 kPa or less. When the supply pressure of the etching gas is in the range described above, the supply of etching gas to chamber 10 is smooth and the load on the parts of the etching apparatus in FIG. 1 (for example, the various apparatuses and pipings described above) is small.

In addition, from the viewpoint of uniformly etching the surface of the target etching member 12, the pressure of the etching gas supplied into the chamber 10 is preferably 1 Pa or more to 80 kPa or less, more preferably 10 Pa or more to 50 kPa or less, and even more preferably 100 Pa or more to 20 kPa or less. When the pressure of etching gas in chamber 10 is in the range described above, a sufficient etching rate is obtained and the etching selectivity ratio easily becomes high.

The pressure in the chamber 10 before supplying etching gas is not particularly limited as long as it is the supply pressure of the etching gas or lower or less than the supply pressure of the etching gas, but for example, $10^{-5}$ Pa or more to less than 10 kPa is preferable and 1 Pa or more to 2 kPa or less is more preferable.

The differential pressure between the supply pressure of the etching gas and the pressure in the chamber 10 before supplying the etching gas is preferably 0.5 MPa or less, more preferably 0.3 MPa or less, and even more preferably 0.1 MPa or less. When the differential pressure is in the ranges described above, it is easier to smoothly perform the supply of the etching gas to the chamber 10.

When supplying the etching gas to chamber 10, it is preferable to carry out the supply while maintaining the temperature of the etching gas at a predetermined value. That is, the supply temperature of the etching gas is preferably 0° C. or higher to 150° C. or lower.

The temperature of the target etching member 12 during etching is preferably 0° C. or higher to 200° C. or lower, more preferably 5° C. or higher to 170° C. or lower, and even more preferably 20° C. or higher to 150° C. or lower. Within these temperature ranges, etching of the etching target (in particular, silicon nitride) of the target etching member 12 proceeds smoothly, the load on the etching apparatus is small, and the life of the etching apparatus is likely to be lengthened.

It is possible to arbitrarily set the processing time of the etching (may be referred to below as "etching time") according to how much of the etching target of the target etching member 12 is to be etched, but considering the production efficiency of the semiconductor element manufacturing process, within 60 minutes is preferable, within 40 minutes is more preferable, and within 20 minutes is even more preferable. The processing time of the etching refers to the time during which the etching gas in plasma form is in contact with the target etching member 12 inside the chamber 10.

It is possible to perform the etching method according to the present embodiment using a general plasma etching apparatus used in a semiconductor element manufacturing step, such as the etching apparatus in FIG. 1, and the configuration of the usable etching apparatus is not particularly limited.

For example, the positional relationship between the fluorine compound gas supply piping 7 and the target etching member 12 is not particularly limited as long as it is possible to bring the etching gas into contact with the target etching member 12. In addition, regarding the configuration of the temperature control mechanism of the chamber 10, it is sufficient to be able to adjust the temperature of the target etching member 12 to an arbitrary temperature, thus, the temperature control mechanism may be configured to be directly provided on the stage 11, or an external temperature controller may be used to heat or cool the chamber 10 from outside the chamber 10.

In addition, the material of the etching apparatus in FIG. 1 is not particularly limited as long as the material has corrosion resistance to the fluorine compounds used and is able to be depressurized to a predetermined pressure. For example, in the portion in contact with the etching gas, it is possible to use metals such as nickel, nickel-based alloys, aluminum, stainless steel, platinum, copper, and cobalt, ceramics such as alumina, fluororesins, and the like.

Specific examples of nickel-based alloys include Inconel (registered trademark), Hastelloy (registered trademark), Monel (registered trademark), and the like. In addition, as fluororesins, examples include polytetrafluoroethylene (PTFE), polychlorotrifluoroethylene (PCTFE), tetrafluoride ethylene/perfluoroalkoxyethylene copolymer (PFA), polyvinylidene fluoride (PVDF), Teflon (registered trademark), Viton (registered trademark), Kalrez (registered trademark), and the like.

EXAMPLES

A more detailed description will be given of the present invention using the following Examples and Comparative Examples.

Example 1

Etching of a target etching member was performed using an etching apparatus having a configuration similar to the configuration of the etching apparatus in FIG. 1. A description will be given of the target etching member used in Example 1 with reference to FIG. 2.

Figure 2:
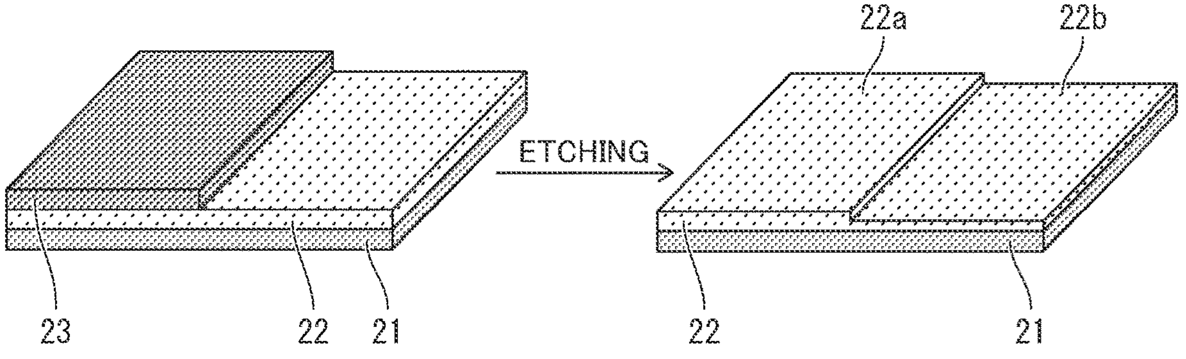
FIG. 2 is a diagram illustrating a target etching member used in Examples 1 to 27 and Comparative Examples 1 to 5.

A substrate (manufactured by Seiren KST Corp.) was prepared by depositing a silicon nitride film 22 with a film thickness of 1 μm on a square-shaped silicon substrate 21 with sides of 2 inches, a rectangular silicon dioxide substrate 23 with dimensions of 1 inch×2 inches was bonded on the silicon nitride film 22 using grease (DEMNUM GREASE L-200 manufactured by Daikin Industries, Ltd.), and the laminate produced in this manner was used as the target etching member. The silicon dioxide substrate 23 was bonded so as to cover a portion of approximately half of the silicon nitride film 22, as illustrated in FIG. 2. The silicon nitride film 22 is the etching target and the silicon dioxide substrate 23, which is the non-etching target, is used as the resist.

In addition, in the target etching member described above, comparative laminates were produced in which the silicon nitride film 22, which was the etching target, was replaced with one of silicon dioxide, a photoresist, and amorphous carbon, which were non-etching targets, respectively, in the film.

The target etching member described above and these three comparative laminates were placed side by side on a stage inside the chamber of the etching apparatus and the temperature of the stage was set to 20° C.

Next, carbonyl fluoride gas at a flow rate of 30 mL/min was mixed with argon at a flow rate of 970 mL/min to make a mixed gas and this mixed gas was used as the etching gas. Then, this etching gas was supplied to the inside of the chamber at a flow rate of 1000 mL/min and passed therethrough for 3 minutes to perform remote plasma etching. The pressure inside the chamber at the time of etching gas passing was 500 Pa. In addition, an intelligent remote plasma source ASTRON Paragon (registered trademark) manufactured by MKS Japan, Inc., was used as a remote plasma generator and the source power was set to 100 W. Due to this, the exposed portion of the silicon nitride film 22 of the target etching member that was not covered by the silicon dioxide substrate 23 was etched. When the etching gas passing was finished, the inside of the chamber was replaced with argon.

When the etching was finished, the chamber was opened to extract the target etching member, the silicon dioxide substrate 23 was removed from the extracted target etching member, and the bonded surfaces were cleaned with ethanol to remove grease. Then, using a VN-8010 atomic force microscope manufactured by Keyence Corporation, the size of the step difference was measured between a cover surface **22*a* of the silicon nitride film 22, which was covered by the silicon dioxide substrate 23 and was not etched, and an etched surface 22*b* of the silicon nitride film 22 that was not covered by the silicon dioxide substrate 23** and was etched. By dividing the size (nm) of the measured step difference by the etching time (min), the silicon nitride etching rate (nm/min) was calculated. The results are illustrated in Table 1.

In addition, the same operation of the target etching members was also performed for the three comparative laminates and, by dividing the size (nm) of the step difference by the etching time (min), the etching rates (nm/min) of the silicon dioxide, the photoresist, and the amorphous carbon were calculated, respectively. Furthermore, the ratio (etching selectivity ratio) of the etching rate of the non-etching target to the etching rate of silicon nitride was calculated for each. The results are illustrated in Table 1.

The conditions for measuring the size of the step difference using an atomic force microscope were as follows.

Measurement Pressure: Atmospheric Pressure (101.3 kPa)

Measurement temperature: 28° C.

Measurement atmosphere: Atmosphere

Scanning range: Width 80.0 μm, height 20.0 μm, angle 0°

TABLE 1

| | Etching gas | | Stage temperature | Pressure inside the | Source power | Etching time | Etching rate (nm/min) | | | | Etching selectivity |
|---|---|---|---|---|---|---|---|---|---|---|---|
| | Composition | Flow rate*) | (° C.) | chamber (Pa) | (W) | (min) | Etching target | | Non-etching target | | ratio |
| Example 1 | $COF_2$/Ar | 30/970 | 20 | 500 | 100 | 3 | Silicon nitride | 15 | Silicon oxide | 2 | 8 |
| | | | | | | | | | Photoresist | 1 | 15 |
| | | | | | | | | | Amorphous carbon | 1 | 15 |
| Example 2 | $COF_2$/Ar | 30/970 | 20 | 500 | 400 | 3 | Silicon nitride | 32 | Silicon oxide | 2 | 16 |
| | | | | | | | | | Photoresist | 2 | 16 |
| | | | | | | | | | Amorphous carbon | 2 | 16 |
| Example 3 | $COF_2$/Ar | 30/970 | 20 | 500 | 800 | 3 | Silicon nitride | 18 | Silicon oxide | 2 | 9 |
| | | | | | | | | | Photoresist | 1 | 18 |
| | | | | | | | | | Amorphous carbon | 1 | 18 |
| Example 4 | $COF_2$/Ar | 150/850 | 20 | 500 | 400 | 3 | Silicon nitride | 30 | Silicon oxide | 3 | 10 |
| | | | | | | | | | Photoresist | 3 | 10 |
| | | | | | | | | | Amorphous carbon | 2 | 15 |
| Example 5 | $COF_2$/Ar | 10/990 | 20 | 500 | 400 | 3 | Silicon nitride | 19 | Silicon oxide | 2 | 10 |
| | | | | | | | | | Photoresist | 1 | 19 |
| | | | | | | | | | Amorphous carbon | 1 | 19 |
| Example 6 | $COF_2$/Ar | 300/700 | 20 | 500 | 400 | 3 | Silicon nitride | 16 | Silicon oxide | 2 | 8 |
| | | | | | | | | | Photoresist | 1 | 16 |
| | | | | | | | | | Amorphous carbon | 1 | 16 |
| Example 7 | $COF_2$/Ar | 30/970 | 20 | 100 | 400 | 3 | Silicon nitride | 23 | Silicon oxide | 2 | 12 |
| | | | | | | | | | Photoresist | 2 | 12 |
| | | | | | | | | | Amorphous carbon | 1 | 23 |
| Example 8 | $COF_2$/Ar | 30/970 | 20 | 1500 | 400 | 3 | Silicon nitride | 30 | Silicon oxide | 2 | 15 |
| | | | | | | | | | Photoresist | 1 | 30 |
| | | | | | | | | | Amorphous carbon | 1 | 30 |
| Example 9 | $COF_2$/Ar | 30/970 | 150 | 500 | 400 | 3 | Silicon nitride | 86 | Silicon oxide | 15 | 6 |
| | | | | | | | | | Photoresist | 8 | 11 |
| | | | | | | | | | Amorphous carbon | 4 | 22 |

Examples 2 to 15

The etching target was a silicon nitride film, the non-etching targets were silicon dioxide, a photoresist, and amorphous carbon, the etching conditions (etching gas composition, stage temperature, pressure in the chamber, etching time, and source power of the remote plasma generator) were as illustrated in Table 1, and remote plasma etching was performed in the same manner as in Example 1. The etching rates of the etching target and non-etching target were each calculated and the etching selectivity ratio was calculated from these values. The results are illustrated in Tables 1 and 2.

TABLE 2

| | Etching gas | | Stage temperature | Pressure inside the | Source power | Etching time | Etching rate (nm/min) | | | | Etching selectivity |
|---|---|---|---|---|---|---|---|---|---|---|---|
| | Composition | Flow rate*) | (° C.) | chamber (Pa) | (W) | (min) | Etching target | | Non-etching target | | ratio |
| Example 10 | $(COF)_2/Ar$ | 30/970 | 20 | 500 | 400 | 3 | Silicon nitride | 26 | Silicon oxide | 2 | 13 |
| | | | | | | | | | Photoresist | 1 | 26 |
| | | | | | | | | | Amorphous carbon | 1 | 26 |
| Example 11 | Hexafluoro-propylene oxide/Ar | 30/970 | 20 | 500 | 400 | 3 | Silicon nitride | 21 | Silicon oxida | 3 | 7 |
| | | | | | | | | | Photoresist | 3 | 7 |
| | | | | | | | | | Amorphous carbon | 2 | 11 |
| Example 12 | $COF_2/Ar/N_2$ | 30/960/20 | 20 | 500 | 400 | 3 | Silicon nitride | 196 | Silicon oxide | 4 | 49 |
| | | | | | | | | | Photoresist | 7 | 28 |
| | | | | | | | | | Amorphous carbon | 7 | 28 |
| Example 13 | $COF_2/Ar/N_2$ | 30/965/5 | 20 | 500 | 400 | 3 | Silicon nitride | 43 | Silicon oxida | 1 | 43 |
| | | | | | | | | | Photoresist | 1 | 43 |
| | | | | | | | | | Amorphous carbon | 1 | 43 |
| Example 14 | $COF_2/Ar/N_2/O_2$ | 30/962/5/3 | 20 | 500 | 400 | 3 | Silicon nitride | 62 | Silicon oxide | 1 | 62 |
| | | | | | | | | | Photoresist | 1 | 62 |
| | | | | | | | | | Amorphous carbon | 4 | 16 |
| Example 15 | $COF_2/Ar$ | 30/970 | 5 | 500 | 400 | 3 | Silicon nitride | 28 | Silicon oxide | 0.5 | 56 |
| | | | | | | | | | Photoresist | 1 | 28 |
| | | | | | | | | | Amorphous carbon | 1 | 28 |
| Comparative Example 1 | $SF_6/Ar$ | 30/970 | 20 | 500 | 400 | 1 | Silicon nitride | 423 | Silicon oxide | 282 | 2 |
| | | | | | | | | | Photoresist | 227 | 2 |
| | | | | | | | | | Amorphous carbon | 310 | 1 |
| Comparative Example 2 | $COF_2/Ar$ | 300/700 | 150 | 500 | 0 | 30 | Silicon nitride | 1 | Silicon oxide | 3 | 0.3 |
| | | | | | | | | | Photoresist | 1 | 1 |
| | | | | | | | | | Amorphous carbon | 1 | 1 |
| Comparative Example 3 | $COF_2/Ar$ | 800/200 | 20 | 500 | 400 | 3 | Silicon nitride | 8 | Silicon oxide | 13 | 0.6 |
| | | | | | | | | | Photoresist | 4 | 2 |
| | | | | | | | | | Amorphous carbon | 3 | 2.7 |

Comparative Example 1

Remote plasma etching was performed in the same manner as in Example 1, except that the etching gas was a mixed gas of sulfur hexafluoride gas and argon, the source power of the remote plasma generator was 400 W, and the etching time was 1 minute. The etching rates of the etching target and non-etching target were each calculated and the etching selectivity ratio was calculated from these values. The results are illustrated in Table 2.

Comparative Example 2

Etching was performed in the same manner as in Example 1, except that the etching gas was a mixed gas of carbonyl fluoride gas at a flow rate of 300 mL/min and argon at a flow rate of 700 mL/min, the stage temperature was set to 150° C., the source power of the remote plasma generator was set to 0 W (that is, no plasma was generated), and the etching time was set to 30 minutes. The etching rates of the etching target and non-etching target were each calculated and the etching selectivity ratio was calculated from these values. The results are illustrated in Table 2.

Comparative Example 3

Remote plasma etching was performed in the same manner as in Example 1, except that the etching gas was a mixed gas of carbonyl fluoride gas with a flow rate of 800 mL/min and argon with a flow rate of 200 mL/min and the source power of the remote plasma generator was set to 400 W. The etching rates of the etching target and non-etching target were each calculated and the etching selectivity ratio was calculated from these values. The results are illustrated in Table 2.

Examples 16 to 27

Etching was performed on the target etching member and the comparative laminates in the same manner as in Example 1, except that the etching gas plasma was generated in the chamber using an ICP etching apparatus RIE-200iP manufactured by Samco Inc., and normal plasma etching was performed in which etching was performed in the chamber using the etching gas plasma and that the etching conditions (etching gas composition, temperature of the stage, pressure inside the chamber, etching time, and source power and bias power of plasma generator) were as illustrated in Table 3. In the same manner as in Example 1, the etching rates of the etching target and non-etching target were each calculated and the etching selectivity ratio was calculated from these values. The results are illustrated in Table 3.

TABLE 3

| | Etching gas | | Stage temperature | Pressure inside the | Source power | Bias power | Etching time | Etching rate (nm/min) | | | | Etching selectivity |
|---|---|---|---|---|---|---|---|---|---|---|---|---|
| | Composition | Flow rate*) | (° C.) | chamber (Pa) | (W) | (W) | (min) | Etching target | | Non-etching target | | ratio |
| Example 16 | $COF_2$/Ar | 10/40 | 20 | 3 | 400 | 20 | 1 | Silicon nitride | 83 | Silicon oxide | 7 | 12 |
| | | | | | | | | | | Photoresist | 15 | 6 |
| | | | | | | | | | | Amorphous carbon | 8 | 10 |
| Example 17 | $COF_2$/Ar | 10/40 | 20 | 3 | 400 | 80 | 1 | Silicon nitride | 101 | Silicon oxide | 14 | 7 |
| | | | | | | | | | | Photoresist | 22 | 5 |
| | | | | | | | | | | Amorphous carbon | 12 | 8 |
| Example 18 | $COF_2$/Ar | 10/40 | 20 | 3 | 400 | 250 | 1 | Silicon nitride | 121 | Silicon oxide | 22 | 14 |
| | | | | | | | | | | Photoresist | 17 | 7 |
| | | | | | | | | | | Amorphous carbon | 11 | 11 |
| Example 19 | $COF_2$/Ar | 10/40 | 20 | 3 | 800 | 20 | 1 | Silicon nitride | 87 | Silicon oxide | 11 | 8 |
| | | | | | | | | | | Photoresist | 15 | 6 |
| | | | | | | | | | | Amorphous carbon | 8 | 11 |
| Example 20 | $COF_2$/Ar | 10/40 | 5 | 3 | 400 | 80 | 1 | Silicon nitride | 95 | Silicon oxide | 13 | 7 |
| | | | | | | | | | | Photoresist | 10 | 10 |
| | | | | | | | | | | Amorphous carbon | 7 | 14 |
| Example 21 | $COF_2$/Ar | 10/40 | 5 | 3 | 400 | 250 | 1 | Silicon nitride | 103 | Silicon oxide | 21 | 5 |
| | | | | | | | | | | Photoresist | 12 | 9 |
| | | | | | | | | | | Amorphous carbon | 15 | 7 |
| Example 22 | $COF_2$/Ar | 5/45 | 20 | 3 | 400 | 80 | 1 | Silicon nitride | 88 | Silicon oxide | 7 | 13 |
| | | | | | | | | | | Photoresist | 12 | 7 |
| | | | | | | | | | | Amorphous carbon | 9 | 10 |
| Example 23 | $COF_2$/Ar | 10/40 | 20 | 6 | 400 | 80 | 1 | Silicon nitride | 111 | Silicon oxide | 5 | 22 |
| | | | | | | | | | | Photoresist | 12 | 9 |
| | | | | | | | | | | Amorphous carbon | 9 | 12 |
| Example 24 | $(COF)_2$/Ar | 10/40 | 20 | 3 | 400 | 80 | 1 | Silicon nitride | 55 | Silicon oxide | 2 | 28 |
| | | | | | | | | | | Photoresist | 3 | 18 |
| | | | | | | | | | | Amorphous carbon | 2 | 28 |
| Example 25 | Hexafluoro-propylene oxide/Ar | 10/40 | 20 | 3 | 400 | 80 | 1 | Silicon nitride | 79 | Silicon oxide | 14 | 6 |
| | | | | | | | | | | Photoresist | 3 | 26 |
| | | | | | | | | | | Amorphous carbon | 6 | 13 |
| Example 26 | COF/AF/$N_2$ | 10/38/2 | 20 | 3 | 400 | 80 | 1 | Silicon nitride | 380 | Silicon oxide | 7 | 54 |
| | | | | | | | | | | Photoresist | 12 | 32 |
| | | | | | | | | | | Amorphous carbon | 9 | 42 |
| Example 27 | $COF_2$/Ar/$N_2$/$O_2$ | 10/36/2/1 | 20 | 3 | 400 | 80 | 1 | Silicon nitride | 419 | Silicon oxide | 5 | 84 |
| | | | | | | | | | | Photoresist | 12 | 35 |
| | | | | | | | | | | Amorphous carbon | 15 | 28 |
| Comparative Example 4 | $SF_6$/Ar | 10/40 | 20 | 3 | 400 | 80 | 1 | Silicon nitride | 566 | Silicon oxide | 220 | 3 |
| | | | | | | | | | | Photoresist | 193 | 3 |
| | | | | | | | | | | Amorphous carbon | 176 | 3 |
| Comparative Example 5 | $COF_2$/Ar | 40/10 | 20 | 3 | 400 | 20 | 1 | Silicon nitride | 51 | Silicon oxide | 60 | 0.9 |
| | | | | | | | | | | Photoresist | 18 | 3 |
| | | | | | | | | | | Amorphous carbon | 18 | 3 |

Comparative Example 4

Plasma etching was performed in the same manner as in Example 16, except that the etching gas was a mixed gas of sulfur hexafluoride gas and argon, and the bias power of the plasma generator was set to 80 W. The etching rates of the etching target and non-etching target were each calculated and the etching selectivity ratio was calculated from these values. The results are illustrated in Table 3.

Comparative Example 5

Plasma etching was performed in the same manner as in Example 16, except that the etching gas was a mixed gas of carbonyl fluoride gas at a flow rate of 40 mL/min and argon at a flow rate of 10 mL/min. The etching rates of the etching target and non-etching target were each calculated and the etching selectivity ratio was calculated from these values. The results are illustrated in Table 3.

Example 28

Figure 3:
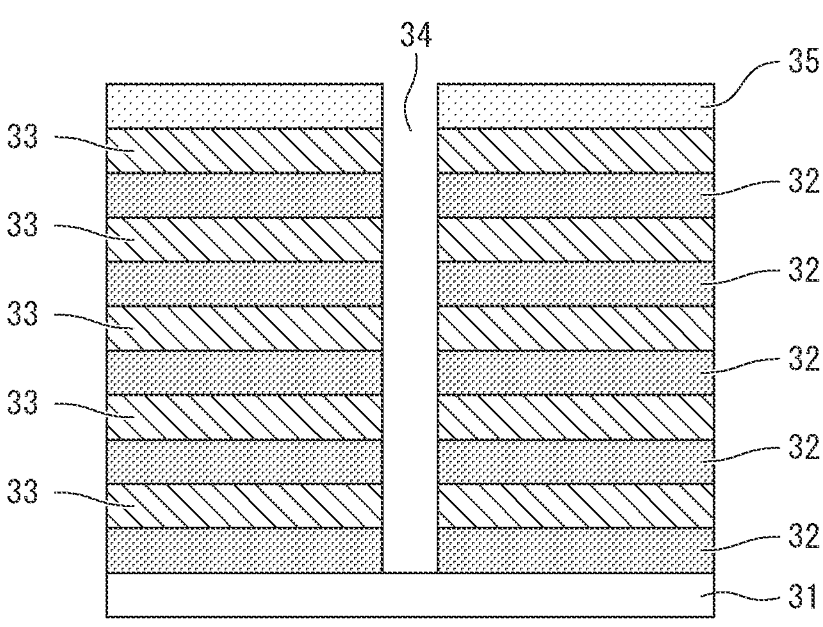
FIG. 3 is a diagram illustrating a target etching member used in Examples 28 to 35.

A description will be given of the target etching member used in Example 28 with reference to FIG. 3. The target etching member in FIG. 3 has a structure in which layers each of a silicon nitride film 32 with a film thickness of 35 nm and a silicon oxide film 33 with a film thickness of 35 nm are alternately laminated on a silicon substrate 31 (in FIG. 3, for convenience, a structure in which 5 layers each of a silicon nitride film 32 and a silicon oxide film 33 are alternately laminated is illustrated). In addition, the target etching member in FIG. 3 has a structure in which an amorphous carbon film 35 with a film thickness of 300 nm is further laminated on the silicon oxide film 33 which is the top layer. Here, the silicon nitride film 32 and the silicon oxide film 33 are etching targets and the amorphous carbon film 35 is a non-etching target. Furthermore, the target etching member in FIG. 3 has a through hole 34 with a diameter of 100 nm that penetrates the 30 layers of the silicon nitride film 32, the 30 layers of the silicon oxide film 33, and the one layer of the amorphous carbon film 35 in the laminating direction.

The target etching member was placed on the stage of an etching apparatus having a configuration similar to the configuration of the etching apparatus in FIG. 1 and the temperature of the stage was set to 20° C. Next, a mixed gas was obtained by mixing carbonyl fluoride gas at a flow rate of 30 mL/min with argon at a flow rate of 970 mL/min and this mixed gas was used as the etching gas. Then, this etching gas was changed to plasma form by remote plasma, supplied to the inside of the chamber, and passed therethrough for 3 minutes to perform remote plasma etching. The pressure inside the chamber during etching gas passing was 500 Pa. After the etching gas passing was finished, the inside of the chamber was replaced with argon.

The chamber was opened and the target etching member was extracted. In the etched target etching member, a portion of the silicon nitride film 32 exposed at the inner surface of the through hole 34 was etched, and in particular, the silicon nitride film 32 was preferentially etched in comparison with the silicon oxide film 33, thus, a part of the inner surface of the through hole 34 was extended outward in the radial direction.

The portion of the silicon oxide film 33 exposed at the inner surface of the through hole 34 was less etched in comparison with the silicon nitride film 32 and the amorphous carbon film 35 was hardly etched, thus, a structure was formed in which the edges of the silicon oxide film 33 and amorphous carbon film 35 protruded into the through hole 34.

The extracted target etching member was cut and the cross-section of the 30-layer silicon nitride film 32 and the cross-section of the 30-layer silicon oxide film 33 were each analyzed using a scanning electron microscope. In detail, for each of the 30 layers of the silicon nitride film 32, the radial direction distance was measured between the portion of the silicon nitride film 32 exposed to the inner surface of the through hole 34 and the portion of the amorphous carbon film 35 exposed at the inner surface of the through hole 34. In addition, for each of the 30 layers of the silicon oxide film 33, the radial direction distance was measured between the portion of the silicon oxide film 33 exposed at the inner surface of the through hole 34 and the portion of the amorphous carbon film 35 exposed at the inner surface of the through hole 34.

That is, due to the etching, the inner surface of the through hole 34 extended outward in the radial direction to increase the radius of the through hole 34 and the difference in radius was measured. Then, by dividing the above by the etching time, the relative etching rate of silicon nitride and silicon oxide with respect to amorphous carbon was calculated. The etching rate of the amorphous carbon was calculated by comparing the diameter of the through holes 34 before and after etching, but almost no change in diameter was seen.

The average value and standard deviation of the etching rate of the 30 layers of the silicon nitride films 32 and the silicon oxide films 33 were then calculated to evaluate whether or not the relative etching rate in the in-plane direction (parallel to the film surface) changes according to the laminating direction position of the film and the uniformity of the relative etching rate. The results are illustrated in Table 4.

TABLE 4

| | Etching gas | | Stage temperature | Pressure inside the | Source power | Etching time | | Average value of etching rate | Standard deviation of etching rate |
|---|---|---|---|---|---|---|---|---|---|
| | Composition | Flow rate*) | (° C.) | chamber (Pa) | (W) | (min) | | (nm/min) | (nm/min) |
| Example 28 | $COF_2$/Ar | 30/970 | 20 | 500 | 200 | 3 | Silicon nitride | 17 | 0.9 |
| | | | | | | | Silicon oxide | 1 | Less than 0.5 |
| | | | | | | | Amorphous carbon | 2 | — |
| Example 29 | $COF_2$/Ar | 30/970 | 20 | 500 | 400 | 3 | Silicon nitride | 32 | 1.4 |
| | | | | | | | Silicon oxide | 2 | Less than 0.5 |
| | | | | | | | Amorphous carbon | 3 | — |
| Example 30 | $COF_2$/Ar | 30/970 | 20 | 500 | 800 | 3 | Silicon nitride | 19 | 1.1 |
| | | | | | | | Silicon oxide | 1 | Less than 0.5 |
| | | | | | | | Amorphous carbon | 2 | — |
| Example 31 | $COF_2$/Ar/$N_2$ | 30/967/3 | 20 | 500 | 400 | 3 | Silicon nitride | 45 | 1.2 |
| | | | | | | | Silicon oxide | 1 | Less than 0.5 |
| | | | | | | | Amorphous carbon | 3 | — |

*)Flow rate of fluorocarbon gas and dilution gas, for example a case where the flow rate of gas is 30 mL/min, and the flow rate of dilution gas is 970 mL/min is denoted as 30/970.

Examples 29 to 31

Plasma etching was performed in the same manner as in Example 28, with the etching conditions (etching gas composition, stage temperature, pressure inside the chamber, etching time, and source power of the plasma generator) as illustrated in Table 4. Then, in the same manner as in Example 28, the relative etching rates of the silicon nitride and the silicon oxide with respect to the amorphous carbon were calculated to calculate the average value of each etching rate and the standard deviation. The results are illustrated in Table 4.

Examples 32 to 35

Etching was performed on the same target etching member as in Example 28 using the ICP etching apparatus RIE-200iP manufactured by Samco Inc. The bias power of the plasma generator was set to 0 W and other etching conditions (etching gas composition, stage temperature, pressure inside the chamber, etching time, and source power of the plasma generator) are illustrated in Table 5. In the same manner as in Example 28, the relative etching rates of the silicon nitride and the silicon oxide with respect to the amorphous carbon were calculated to calculate the average value of each etching rate and the standard deviation. The results are illustrated in Table 5.

TABLE 5

| | Etching gas | | Stage temperature | Pressure inside the chamber (Pa) | Source power | Etching time | | Average value of etching rate | Standard deviation of etching rate |
|---|---|---|---|---|---|---|---|---|---|
| | Composition | Flow rate*) | (° C.) | | (W) | (min) | | (nm/min) | (nm/min) |
| Example 32 | $COF_2$/Ar | 10/40 | 20 | 3 | 200 | 1 | Silicon nitride | 78 | 5.0 |
| | | | | | | | Silicon oxide | 8 | 3.0 |
| | | | | | | | Amorphous carbon | 8 | — |
| Example 33 | $COF_2$/Ar | 10/40 | 20 | 3 | 400 | 1 | Silicon nitride | 85 | 1.4 |
| | | | | | | | Silicon oxide | 10 | 3.0 |
| | | | | | | | Amorphous carbon | 12 | — |
| Example 34 | $COF_2$/Ar | 10/40 | 20 | 3 | 800 | 1 | Silicon nitride | 63 | 1.1 |
| | | | | | | | Silicon oxide | 8 | 2.0 |
| | | | | | | | Amorphous carbon | 9 | — |
| Example 35 | $COF_2$/Ar/$N_2$ | 10/38/2 | 20 | 3 | 400 | 1 | Silicon nitride | 357 | 17.0 |
| | | | | | | | Silicon oxide | 9 | 2.0 |
| | | | | | | | Amorphous carbon | 11 | — |

*)Flow rate of fluorocarbon gas and dilution gas, for example a case where the flow rate of gas is 30 mL/min, and the flow rate of dilution gas is 970 mL/min is denoted as 30/970.

From the results of Examples 1 to 3, the etching rate of silicon nitride was greater in a case where the source power was 400 W in comparison with a case where the source power was 100 W or 800 W. On the other hand, the etching of the non-etching target hardly proceeded regardless of the source power.

The results of Examples 4 to 6 suggest that there is a point in the concentration of carbonyl fluoride in the etching gas at which the silicon nitride etching rate reaches a maximum. On the other hand, the etching of the non-etching target hardly proceeded regardless of the concentration of carbonyl fluoride in the etching gas.

From the results of Examples 7 and 8, it is clear that the etching of silicon nitride proceeds without problems even in cases where the pressure inside the chamber is set to 100 Pa and 1500 Pa. On the other hand, the etching of the non-etching target hardly proceeded.

From the results of Examples 9 and 15, it is clear that the etching rates of silicon nitride which is the etching target and the silicon oxide, photoresist, and amorphous carbon which are the non-etching targets are improved as the stage temperature is increased.

From the results of Examples 10 and 11, it is clear that even in a case where oxalyl fluoride and hexafluoropropylene oxide are used as the etching gases, the etching of the silicon nitride proceeds and the etching of the non-etching target hardly proceeds.

From the results of Examples 12 and 13, it is clear that the etching rate of silicon nitride is improved in a case where a mixed gas of carbonyl fluoride, argon, and nitrogen gases is used as the etching gas. In addition, the etching of the non-etching targets also proceeded slightly. It is considered that the reason for the improved etching rate of silicon nitride may be that the addition of nitrogen gas promoted the dissociation of fluorine atoms from the carbonyl fluoride.

From the results of Example 14, it is clear that the etching rate and etching selectivity ratio of silicon nitride are further improved in a case where a mixed gas containing oxygen gas in addition to carbonyl fluoride, argon, and nitrogen gas is used as the etching gas. It is considered that the addition of the oxygen gas further promoted the dissociation of fluorine atoms from carbonyl fluoride.

From the results of Comparative Example 1, it is clear that, when sulfur hexafluoride is used as the etching gas, both silicon nitride and the non-etching target are etched.

From the results of Comparative Example 2, it is clear that under conditions where no plasma is generated, selectively etching silicon nitride is difficult since the etching of the silicon oxide, photoresist, and amorphous carbon proceeds at the same rate as silicon nitride.

From the results of Comparative Example 3, it is clear that the etching of the silicon oxide, photoresist, and amorphous carbon proceeds along with the etching of the silicon nitride also in a case where the concentration of carbonyl fluoride in the etching gas is excessively high.

From the results of Examples 16 to 27, it is clear that it is possible to selectively etch silicon nitride in comparison with non-etching targets even when using the ICP etching apparatus. In addition, it is clear that the etching rate of silicon nitride is improved in a case where the bias power is increased or in a case where a mixed gas with nitrogen gas added thereto is used as the etching gas. In addition, it is clear that, in a case where a mixed gas to which nitrogen gas and oxygen gas are added is used as the etching gas, the etching rate of silicon nitride is further improved. On the other hand, in a case where the source power was increased, in a case where the concentration of carbonyl fluoride in the etching gas was decreased, and in a case where oxalyl fluoride and hexafluoropropylene oxide were used as the etching gas, no significant influence on the etching rate of silicon nitride and non-etching targets was observed.

From the results of Comparative Example 4, it is clear that, when sulfur hexafluoride is used as the etching gas, the silicon oxide, the photoresist, and the amorphous carbon, which are non-etching targets, are etched along with the silicon nitride.

From the results of Comparative Example 5, it is clear that the silicon oxide, photoresist, and amorphous carbon, which are non-etching targets, are etched along with the silicon nitride also in a case where the concentration of carbonyl fluoride in the etching gas is excessively high.

From the results of Examples 28 to 35, it is clear that, when etching is performed on a laminated film of amorphous carbon, silicon nitride, and silicon oxide, it is possible to selectively etch the silicon nitride layer.

The ratio of the standard deviation of the etching rate with respect to the average value of the etching rate of silicon nitride is approximately 2% to 7%, thus, it is clear that the etching of the 30 layers of the silicon nitride film 32 proceeds almost uniformly, with no relationship to the position of the silicon nitride film 32 in the laminating direction. In contrast, the etching rates of silicon oxide and amorphous carbon were smaller than the etching rate of silicon nitride under all conditions. In addition, the standard deviation of the etching rate of silicon oxide was 3 or less under all conditions.

REFERENCE SIGNS LIST

1 . . . fluorine compound gas supply portion
2 . . . noble gas supply portion
3 . . . nitrogen gas supply portion
4 . . . fluorine compound gas flow rate controller
5 . . . noble gas flow rate controller
6 . . . nitrogen gas flow rate controller
7 . . . fluorine compound gas supply piping
8 . . . noble gas supply piping
9 . . . nitrogen gas supply piping
10 . . . chamber
11 . . . stage
12 . . . target etching member
13 . . . exhaust piping
14 . . . thermometer
15 . . . vacuum pump
16 . . . pressure gauge
17 . . . fluorine compound gas pressure controller
18 . . . noble gas pressure controller
19 . . . nitrogen gas pressure controller
20 . . . remote plasma generator
21 . . . silicon substrate
22 . . . silicon nitride film
23 . . . silicon dioxide substrate
31 . . . silicon substrate
32 . . . silicon nitride film
33 . . . silicon oxide film
34 . . . through hole
35 . . . amorphous carbon film

The invention claimed is:

1. An etching method comprising:

bringing, in the presence of plasma, an etching gas consisting of a fluorine compound with 3 or fewer carbon atoms either having at least one bond of a carbon-oxygen double bond or having at least one ether bond in a molecule of the fluorine compound, a noble gas, and a nitrogen gas into contact with a target etching member having an etching target which is an object to be etched by the etching gas and a non-etching target which is not an object to be etched by the etching gas, and selectively etching the etching target in comparison with the non-etching target, wherein a concentration of the fluorine compound in the etching gas is 0.5 vol % or more to 40 vol % or less, wherein a concentration of the nitrogen gas in the etching gas is 10 vol % or less and 0 vol % or more, and wherein the etching target has silicon nitride.

2. The etching method according to claim 1, wherein the non-etching target has at least one selected from silicon oxide, a photoresist, and amorphous carbon.

3. The etching method according to claim 2, wherein the etching is performed under a pressure condition of 1 Pa or more to 3 kPa or less.

4. The etching method according to claim 2, wherein the etching is performed under a temperature condition of 0° C. or higher to 200° C. or lower.

5. The etching method according to claim 2, wherein the concentration of the fluorine compound in the etching gas is 1 vol % or more to 30 vol % or less.

6. The etching method according to claim 1, wherein the etching is performed under a pressure condition of 1 Pa or more to 3 kPa or less.

7. The etching method according to claim 6, wherein the etching is performed under a temperature condition of 0° C. or higher to 200° C. or lower.

8. The etching method according to claim 6, wherein the concentration of the fluorine compound in the etching gas is 1 vol % or more to 30 vol % or less.

9. The etching method according to claim 1, wherein the etching is performed under a temperature condition of 0° C. or higher to 200° C. or lower.

10. The etching method according to claim 9, wherein the concentration of the fluorine compound in the etching gas is 1 vol % or more to 30 vol % or less.

11. The etching method according to claim 1, wherein the concentration of the fluorine compound in the etching gas is 1 vol % or more to 30 vol % or less.

12. The etching method according to claim 1, wherein the noble gas is at least one selected from helium, argon, neon, krypton, and xenon.

13. The etching method according to claim 1, wherein the fluorine compound is at least one selected from carbonyl fluoride, oxalyl fluoride, and hexafluoropropylene oxide.

14. A semiconductor element manufacturing method for manufacturing a semiconductor element using the etching method according to claim 1, wherein the target etching member is a semiconductor substrate having the etching target and the non-etching target, and the semiconductor element manufacturing method includes removing at least a part of the etching target from the semiconductor substrate by the etching.

* * * * *